(12) United States Patent
Reinbach

(10) Patent No.: US 6,450,663 B1
(45) Date of Patent: Sep. 17, 2002

(54) LIGHT-EMITTING-DIODE ARRANGEMENT

(75) Inventor: Martin Reinbach, Howick/Auckland (NZ)

(73) Assignee: Hella KG Hueck & Co., Lippstadt (DE)

(*) Notice: Subject to any disclaimer, the term of this patent is extended or adjusted under 35 U.S.C. 154(b) by 0 days.

(21) Appl. No.: 09/617,428

(22) Filed: Jul. 14, 2000

(30) Foreign Application Priority Data

Jul. 15, 1999 (DE) ......................................... 199 33 060

(51) Int. Cl.⁷ ............................................... F21V 21/00
(52) U.S. Cl. ..................... 362/249; 362/240; 362/252; 362/545; 362/800
(58) Field of Search ................................. 362/545, 249, 362/240, 294, 373, 800, 252

(56) References Cited

U.S. PATENT DOCUMENTS

| | | | | |
|---|---|---|---|---|
| 4,575,785 A | * | 3/1986 | Lerude et al. | 362/800 |
| 4,654,629 A | * | 3/1987 | Bezos et al. | 246/473.3 |
| 5,857,767 A | * | 1/1999 | Hochtein | 362/800 |

FOREIGN PATENT DOCUMENTS

| | | |
|---|---|---|
| DE | U1-29603557 | 5/1996 |
| DE | U1-29720060 | 2/1998 |
| DE | A1-19646042 | 5/1998 |
| DE | U1-29905944 | 9/1999 |

* cited by examiner

*Primary Examiner*—Sandra O'Shea
*Assistant Examiner*—Guiyoung Lee
(74) *Attorney, Agent, or Firm*—Birch, Stewart, Kolasch & Birch, LLP

(57) ABSTRACT

A light-emitting-diode arrangement specifically for a vehicle signal light, having a beam direction obliquely oriented relative to a base plane, includes a support plate and a plurality of light-emitting diodes arranged on the support plate, with the support plate being arranged parallel to the base plane and the light-emitting diodes each having a base body, inclined in the beam direction, which is oblique to the support plate. A method for obliquely arranging the plurality of light-emitting diodes on the support plate includes: a first step, in which a first pair of contact pins arranged at a first end of each base body of the light-emitting diodes are inserted into guide holes of the support plate, with free ends of a second contact pair arranged at a second end opposite the first end extending into an adjacent opening; a second step in which the first pair of contact pins of the light-emitting diode are soldered to the support plate; a third step in which the light-emitting diode is tipped, or inclined, so that the second end of the base body extends into the opening and its underside facing toward the support plate presses against an inner edge of the opening; and a fourth step, in which free ends of the second pair of contact pins are bent against the underside of the support plate.

13 Claims, 3 Drawing Sheets

LIGHT-EMITTING-DIODE ARRANGEMENT

BACKGROUND OF THE INVENTION

This invention relates to a light-emitting-diode arrangement specifically for a vehicle signal light, having a beam direction obliquely oriented relative to a base plane, including a support plate and a plurality of light-emitting diodes arranged on the support plate.

The invention further relates to a method for obliquely arranging a plurality of light-emitting diodes on a support plate.

Specifically in signal lights for motor vehicles, the problem arises that often a beam direction is desired that is not oriented perpendicular to a base plane, but is oriented obliquely relative to the base plane.

German patent document (DE 297 20 060 U1) discloses a motor vehicle light wherein a plurality of light-emitting diodes are arranged with their beam directions oblique relative to a base plane. For this purpose, the light-emitting diodes are arranged on support plates with their beam directions being arranged perpendicular to the planes of the support plates. The light-emitting diodes have base bodies that are fastened by their contact pins into guide holes of the support plate.

It is disadvantageous in the signal light of the known art that, for inclining the beam direction relative to the base plane, the support plates must be arranged so that they are inclined or oblique relative to the base plane. This leads to a relatively complicated and expensive mounting of the support plates. Additionally, a plurality of support plates must be used.

Furthermore, German patent document (DE 196 46 042 A1) discloses a lighting device for vehicles in which beam directions of light-emitting diodes, which are arranged on a spatially curved support plate, are deviated by use of pre-positioned deviating elements.

It is disadvantageous, in this arrangement, that the arrangement of deviating elements is also relatively laborious and costly.

It is an object of this invention to improve signal lights known in the art and light-emitting-diode arrangements known in the art in such a way that desired oblique orientations of beam directions is achieved simply and inexpensively.

It is a further object of the invention to provide an improved method for obliquely arranging light-emitting diodes known in the art.

SUMMARY OF THE INVENTION

According to principles of the invention a support plate is arranged parallel to a base plane and light-emitting diodes have a base body arranged on the support plate obliquely, inclined in the beam direction.

Since the support plate can be arranged parallel to the base plane, and only the light-emitting diodes with their base bodies are arranged obliquely on the support plate, the support plate can be arranged more simply and more inexpensively in a housing surrounding it. It is also possible to make do with only one support plate, or at least with fewer support plates than previously. In this solution, a required mounting depth is also significantly reduced.

According to a preferred embodiment of the invention, each base body has a first pair of contact pins on its first end, spaced from but adjacent to the support plate, free ends of the contact pins being fastened into contact holes of the support plate, with the base body, at its second end opposite the first end, having a second pair of contact pins that mechanically hold the base body relative to the support plate. In this arrangement, the support plate has an opening into which the second end of the base body extends far enough that its underside, facing toward the support plate, presses against a back inner edge of the opening that is toward the contact hole. Free ends of the second pair of contact pins fit tightly against an underside of the support plate.

Because the second end of the base body extends into an opening of the support plate, the mounting depth is reduced even further. Additionally, by supporting the base body on the inner edge of the opening and by fitting the free ends of the second pair of contact pins tightly to the underside of the support plate, relatively good stability is achieved, which prevents undesirable vibration or shaking of the light-emitting diodes.

According to a further preferred embodiment of the invention, the angle of inclination of the light-emitting diodes is determined by a width of the opening and by the arrangement of the back inner edge. In this way, various directions of beams can be achieved in a simple manner.

According to a further preferred embodiment of the invention, the support plate has guide holes, the longitudinal axis of which is arranged in the beam direction and in which the contact pins of the light-emitting diodes are arranged so that the second end of the base body can be supported on the support plate.

Openings can be omitted owing to the oblique arrangement of the guide holes.

According to a further preferred embodiment of the invention, the light-emitting diodes are directed in various directions of beams. It is essentially possible to combine light-emitting diodes arranged perpendicularly in a conventional manner on the support plate with obliquely arranged light-emitting diodes.

According to a further preferred embodiment of the invention, the support plate has a heat dissipation element arranged on an underside thereof facing away from the light-emitting diodes.

By providing a heat dissipation element, the light-emitting-diode arrangement is protected from overheating, on the one hand, and mechanical stability is increased, on the other hand.

According to further principles of the invention, in a first operational step, the first pair of contact pins at the first end of the base body of each light-emitting diode are inserted into guide holes of the support plate, with the free ends of the second contact pair arranged on the second end facing away from the first end, extending into an adjacent opening, and in a second step the first pair of contact pins of the light-emitting diodes are soldered to the support plate. In a third step the light-emitting diodes are tilted so that the second ends of the base bodies extend into the openings and their undersides facing toward the support plate press against an inner edge of the opening. In a fourth step, the free ends of the second pair of contact pins are bent against the underside of the support plate.

Since the light-emitting diodes are mounted obliquely on the support plate, an oblique arrangement of the support plate can be omitted. With these steps of the invention, it is also possible to automate the steps of the method. According to the method of this invention, the light-emitting diodes can be mounted relatively easily and inexpensively. Additionally, the requisite stability is achieved in a simple manner.

The light-emitting diodes arranged according to the invention can be used for rear lights, indicator lights, side marking lights, and interior light for motor vehicles.

BRIEF DESCRIPTION OF THE DRAWINGS

The invention is described and explained in more detail below using embodiments shown in the drawings. The described and drawn features can be used individually or in preferred combinations in other embodiments of the invention. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DESCRIPTION OF THE PREFERRED EMBODIMENT

Figure 1:
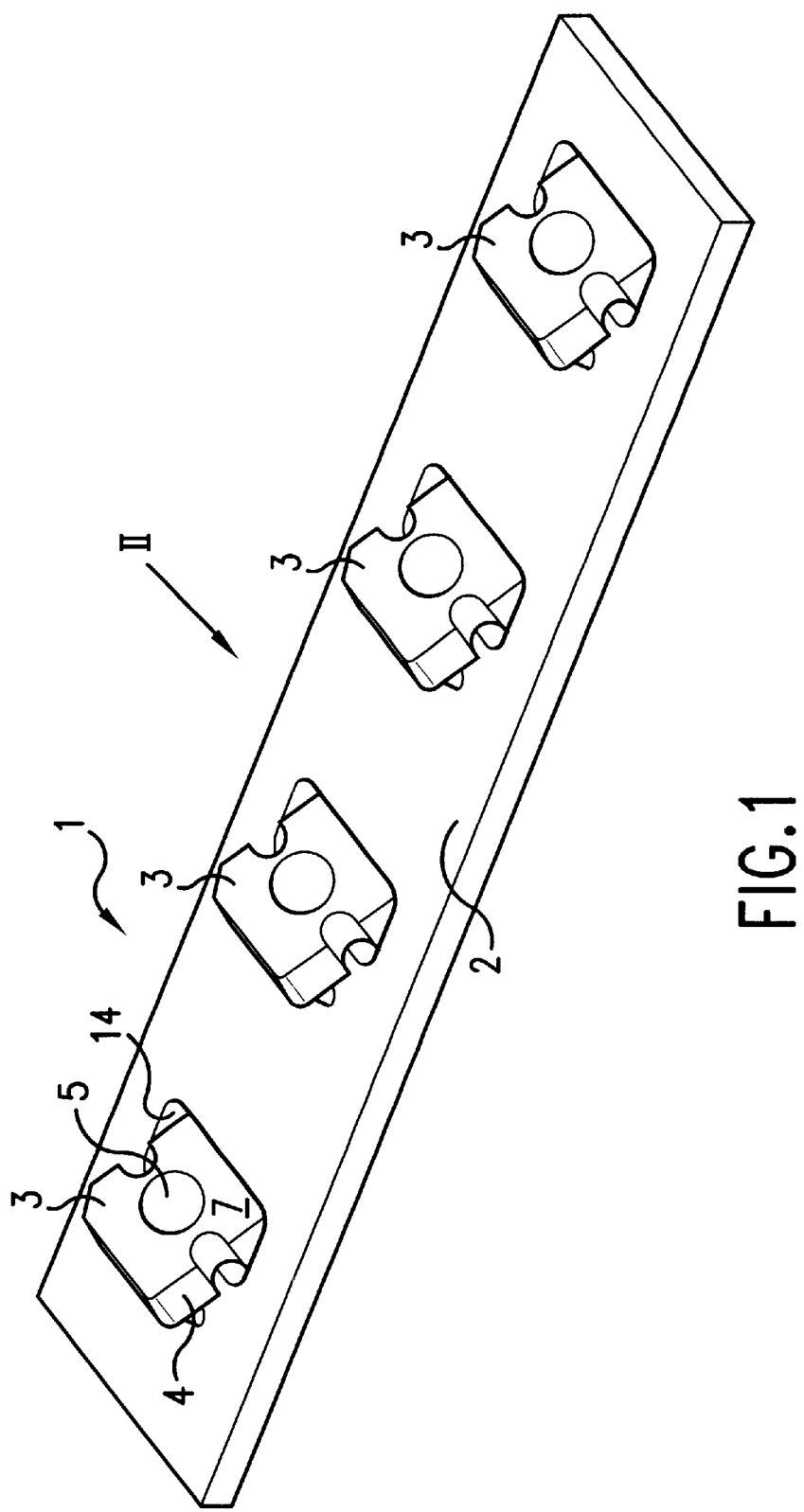
FIG. 1 is an enlarged three-dimensional view of a light-emitting-diode arrangement of this invention.
Figure 2:
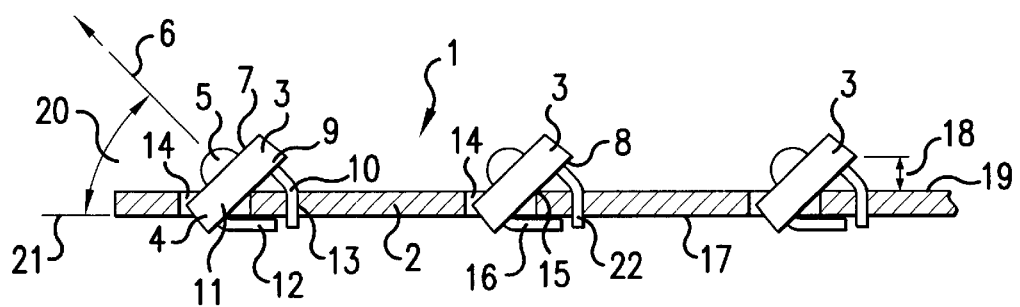
FIG. 2 is a sectional side view of the light-emitting-diode arrangement of FIG. 1, in direction II.
Figure 3:
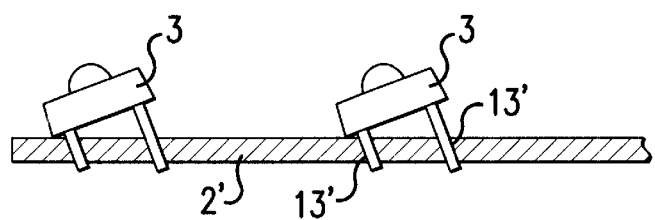
FIG. 3 is a sectional side view of a further light-emitting-diode arrangement.
Figure 4:
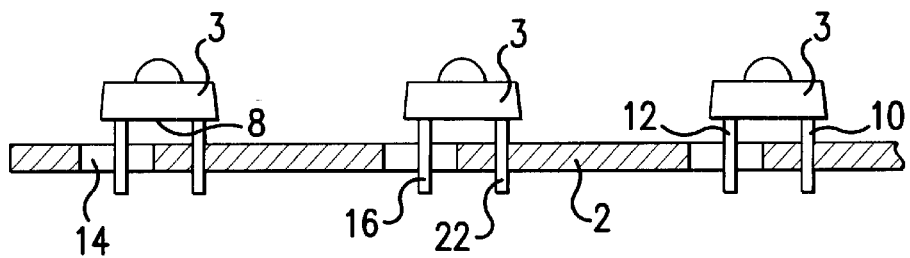
FIG. 4 is a side view of the light-emitting-diode arrangement of FIG. 1 with light-emitting diodes inserted into a support plate.
Figure 5:
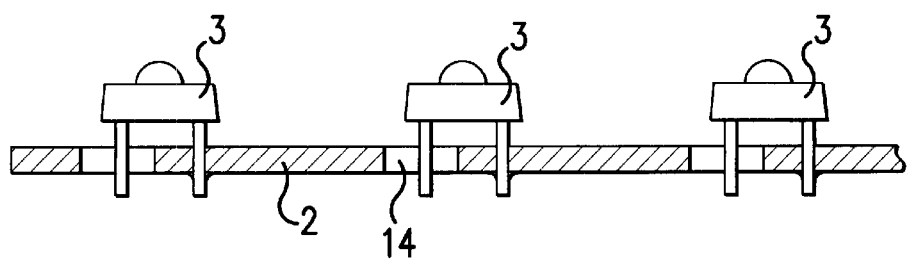
FIG. 5 is a sectional side view of the light-emitting-diode arrangement of FIG. 4 with soldered first pairs of contact pins.
Figure 6:
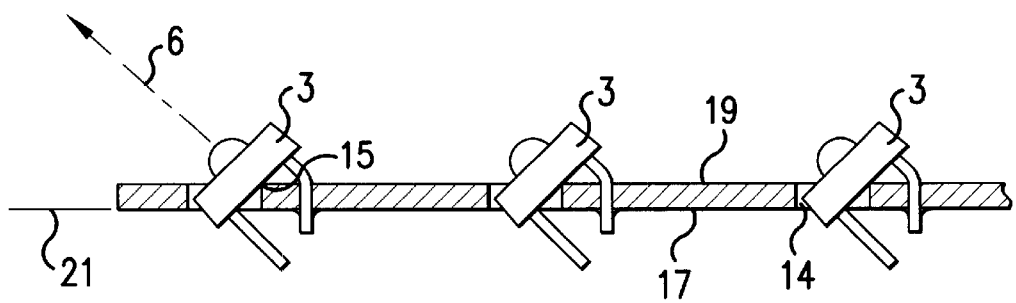
FIG. 6 is a sectional side view of the light-emitting-diode arrangement of FIG. 5 with tilted main structures.

A light-emitting-diode arrangement 1 includes mainly a support plate 2 and a plurality of light-emitting diodes, or LEDs, 3. Piranha-LEDs, for example, are used as light-emitting diodes 3. The light-emitting diodes 3 have a base body 4 which emit light through a light emission surface 5. A beam direction 6 is arranged perpendicular to a base body surface 7. On its underside 8, facing away from the base body surface 7, the base body has a first pair of contact pins 10 on its first end 9. On its second end 11, opposite the first end 9, the base body 7 has a second pair of contact pins 12 on its underside 8.

The support plate 2 is arranged in, or parallel to, a base plane 21. The support plate 2 has strip conductors (not shown) and also, if applicable, electronic components (not shown) for controlling the light-emitting diodes 3.

For each light-emitting diode 3, the support plate 2 has two guide holes 13, in which, respectively, the first pair of contact pins 10 is positioned. At a spacing from the guide holes 13, an opening 14 is arranged respectively on the support plate 2, into which the second end 11 of the adjacent base body 4 extends. In this arrangement, the opening 14 has a rear inner edge 15 adjacent the guide holes 13, against which the underside 8 of the base body 4 presses.

Free ends 16 of the second pair of contact pins 12 lie against an underside 17 of the support plate 2.

It is essentially also possible to have two or more light-emitting diodes 3 arranged parallel, alongside each other, extending into a common opening 14.

A width of the opening 14 and the arrangement of the rear inner edge 15 jointly determine, with a spacing 18 from a carrier surface 19, an angle of inclination 20 formed between the beam direction 6 and the carrier surface 19.

A heat dissipation element (not shown) can be arranged on the underside 17 of the support plate 2, over which heat from the LEDs 3 can be dissipated. While the first pair of contact pins 10 is used for mechanical mounting and electrical contacting, the second pair of contact pins 12 is used solely for mechanical mounting.

According to a further embodiment, a support plate 2' has obliquely arranged guide holes 13' for both the first pair of contact pins 10 and for the second pair of contact pins 12.

For fabricating the light-emitting-diode arrangement 1, in a first operational step, the respective first pair of contact pins 10 of the LEDs 3, that is their free ends 22, are inserted into the guide holes 13 of the support plate 2. The free ends 16 of the second pair of contact pins 12 thereby extend into the adjacent opening 14.

In a second step, the first pair of contact pins 12 is soldered to the support plate 2 at its guide holes 13.

In a third step, each of the base bodies 4 is tilted, or skewed, so that its second end extends into the adjacent opening 14, and its underside 8 facing toward the support plate 2 contacts the rear inner edge 15 of the opening 14.

In a fourth step, the free ends 16 of the second pair of contact pins 12 are bent against the underside 17 of the support plate 2.

The invention claimed is:

1. A light-emitting-diode arrangement specifically for a vehicle signal light, having a beam direction obliquely oriented relative to a base plane, comprising a support plate and a plurality of light-emitting diodes arranged on the support plate, wherein the support plate (2, 2') is arranged parallel to the base plane (21) and each of the light-emitting diodes (3) has a base body (4) that is inclined on the support plate (2, 2') in the beam direction (6), oblique to the base plane, wherein the base bodies (4) of said light-emitting diodes are joined directly to the support plate by contact pins.

2. The light-emitting-diode arrangement of claim 1, wherein said contact pins further include first and second contact pins, and wherein the base body (4) has the first contact pin (10) on a first end (9) thereof, which first end. is adjacent to and spaced at a spacing (18) from the support plate (2, 2'), with a free end (22) of the first contact pin being fastened in a guide hole (13, 13') of the support plate, and wherein the base body (4) has the second contact pin (12) at a second end (11) thereof, opposite the first end (9), that holds the base body (40) mechanically to the support plate (2, 2').

3. The light-emitting-diode arrangement as in claim 1, wherein the support plate(2) has an opening (14) into which a second end (11) of the base body (4) extends.

4. The light-emitting-diode arrangement of claim 2, wherein a free end (16) of the. second contact pin (12) lies against an underside (17) of the support plate (2).

5. The light-emitting-diode arrangement of claim 3, wherein a plurality of light-emitting diodes (3) arranged in parallel to each other extend into the opening (14).

6. The light-emitting-diode arrangement of claim 3, wherein a width of the opening (14) determines an angle of inclination (20) of the light-emitting diode (3).

7. The light-emitting-diode arrangement of claim 2, wherein the support plate (2') has guide holes (13), the longitudinal axis of which are arranged in the beam direction, and in which said first and second contact pins .(10, 12) of the light-emitting diodes (3) are arranged so-that the second end (11) of the base body (4) is supported on the support plate (2').

8. The light-emitting-diode arrangement of claim 1, wherein the light-emitting diodes (3) are directed in different beam directions (6).

9. The light-emitting-diode arrangement of claim 1, wherein the support plate (2, 2') has a heat dissipation element on its underside (17) facing away from the light-emitting diodes (3).

10. A method for obliquely arranging a plurality of light-emitting diodes on a support plate, wherein: in a first step, a first pair of contact pins (10) arranged at a first end (9) of a base body (4) of each light-emitting diode (3) is inserted into guide holes (13) of the support plate (2), with free ends (16) of a second contact pair (12) arranged at a second end (11) opposite the first end (9), extending into an adjacent opening (14) in the support plate; in a second step the first pairs of contact pins (10) of the light-emitting diode (3) are soldered to the support plate (2); in a third step the light-emitting diode (3) is tipped so that the second end (11) of the base body (4) extends into the opening (14) and its underside (8) facing toward the support plate (2) contacts an inner edge (15) of the opening (14); and in a fourth step free ends (16) of the second pair of contact pins (12) are bent against an underside (17) of the support plate (2).

11. A method for obliquely arranging a plurality of light-emitting diodes on a support plate, wherein: in a first step, a first contact pin (10) arranged at a first end (9) of a base body (4) of each light-emitting diode (3) is inserted into guide holes (13) of the support plate (2), with a free end (16) of a second contact pin (12) arranged -at a second end (11) opposite the first end (9), extending into an adjacent opening (14) in the support plate; in a second step the first contact pin (10) of the light-emitting diode (3) is soldered to the support plate (2); in a third step the light-emitting diode (3) is tipped so that the second end (11) of the base body (4) extends into the opening (14) and its underside (8) facing toward the support plate (2) contacts an inner edge (15) of-the opening (14); and in a fourth step the free end (16) of the second contact pin (12) is bent against an underside (17) of the support plate (2).

12. A light-emitting-diode arrangement specifically for a vehicle signal light, having a beam direction obliquely oriented relative to a base plane, comprising a support plate defining hole openings and a plurality of light-emitting diodes arranged on the support plate, wherein the support plate is arranged parallel to the base plane and each of the light-emitting diodes has a base body that is inclined on the support plate in the beam direction, oblique to the base plane, wherein the light-emitting diodes have contact pins which pass through said hole openings of the support plate.

13. The light-emitting-diode arrangement of claim 12, wherein the contact pins engage said support plate at said hole openings for supporting. said light-emitting diodes such that said base body is inclined to said support plate.

* * * * *